US011342902B2

(12) United States Patent
Jeong

(10) Patent No.: US 11,342,902 B2
(45) Date of Patent: May 24, 2022

(54) COMMUNICATION MODULE

(71) Applicant: Samsung Electro-Mechanics Co., Ltd., Suwon-si (KR)

(72) Inventor: Chan Yong Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 237 days.

(21) Appl. No.: 16/786,222

(22) Filed: Feb. 10, 2020

(65) Prior Publication Data
US 2021/0126623 A1 Apr. 29, 2021

(30) Foreign Application Priority Data

Oct. 25, 2019 (KR) .................. 10-2019-0133963

(51) Int. Cl.
| | |
|---|---|
| *H01L 25/00* | (2006.01) |
| *H01L 25/065* | (2006.01) |
| *H03H 9/64* | (2006.01) |
| *H01Q 1/38* | (2006.01) |
| *H03H 3/007* | (2006.01) |
| *H03H 9/05* | (2006.01) |
| *H03H 9/54* | (2006.01) |
| *H01Q 5/314* | (2015.01) |

(52) U.S. Cl.
CPC ............ *H03H 9/6433* (2013.01); *H01Q 1/38* (2013.01); *H01Q 5/314* (2015.01); *H03H 3/0072* (2013.01); *H03H 9/0576* (2013.01); *H03H 9/542* (2013.01)

(58) Field of Classification Search
CPC ... H01L 25/00; H01L 25/043; H01L 25/0652; H01L 25/0655; H01L 25/0657
See application file for complete search history.

(56) References Cited

U.S. PATENT DOCUMENTS

| | | | | |
|---|---|---|---|---|
| 6,472,952 B1 * | 10/2002 | Sakai | ...................... | H04B 1/50 333/126 |
| 7,053,731 B2 | 5/2006 | Iwamoto et al. | | |
| 7,167,688 B2 * | 1/2007 | Li | ............................ | H04B 1/38 455/106 |
| 9,007,146 B2 | 4/2015 | Nishizawa | | |
| 2009/0302970 A1 * | 12/2009 | Hatano | ................ | H03H 9/0571 333/133 |
| 2017/0162550 A1 * | 6/2017 | Das | ..................... | H01L 23/5329 |

FOREIGN PATENT DOCUMENTS

| | | |
|---|---|---|
| KR | 10-0717659 B1 | 5/2007 |
| KR | 10-1319195 B1 | 10/2013 |

* cited by examiner

*Primary Examiner* — Dean O Takaoka
(74) *Attorney, Agent, or Firm* — NSIP Law

(57) ABSTRACT

A communications module includes a module substrate composed of a plurality of insulating layers, a plurality of wiring layers, and a plurality of wiring vias; and a filter module disposed on the module substrate. At least one of the wiring layers overlaps the filter module in a thickness direction of the module substrate and is connected to a ground potential to function as a ground layer, and an entirety of at least one of the wiring layers and at least one of the wiring vias disposed in a first region in the thickness direction of the module substrate between the filter module and the ground layer are electrically connected to the filter module.

15 Claims, 3 Drawing Sheets

COMMUNICATION MODULE

CROSS-REFERENCE TO RELATED APPLICATION(S)

This application claims the benefit under 35 USC 119(a) of Korean Patent Application No. 10-2019-0133963 filed on Oct. 25, 2019 in the Korean Intellectual Property Office, the entire disclosure of which is incorporated herein by reference for all purposes.

BACKGROUND

1. Field

The following description relates to a communication module.

2. Description of Background

Fifth generation (5G) communications are expected to efficiently connect more devices with larger amounts of high-capacity data and faster data rates than traditional Long Term Evolution (LTE) communications.

Fifth generation communications are developing in a direction of using a frequency band of 24250 MHz to 52600 MHz corresponding to a millimeter wave (mmWave) band and a frequency band of 450 MHz to 6000 MHz corresponding to a sub-6 GHz band.

Each of a n77 band (3300 MHz to 4200 MHz), a n 78 band (3300 MHz to 3800 MHz) and a n79 band (4400 MH to 5000 MHz) is defined as one of operating bands of sub-6 GHz, and the n77 band (3300 MHz to 4200 MHz), the n78 band (3300 MHz to 3800 MHz), the n79 band (4400 MH to 5000 MHz), and the like, will be used as main bands due to advantages thereof of having a wide bandwidth.

In order to support multi-band communications, a multi-input/multi-output (MIMO) system is applied. MIMO is a technology that can expand a supporting band in proportion to the number of antennas. However, according to a trend of slimming and miniaturizing mobile devices, there is a limitation in a space in which an antenna is mounted, and there is a physical limitation in implementing an antenna additionally, under conditions in which antennas used in the existing system exist.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A communications module that can connect one antenna to a plurality of front-end modules, by improving a frequency response characteristic of a filter module according to a design of a module substrate.

In one general aspect, a communications module includes a module substrate composed of a plurality of insulating layers, a plurality of wiring layers, and a plurality of wiring vias; and a filter module disposed on the module substrate. At least one of the wiring layers overlaps the filter module in a thickness direction of the module substrate and is connected to a ground potential to function as a ground layer, and an entirety of at least one of the wiring layers and at least one of the wiring vias disposed in a first region in the thickness direction of the module substrate between the filter module and the ground layer are electrically connected to the filter module.

The ground layer may have a shape corresponding to a shape of the filter module.

The ground layer may overlap at least a portion of the filter module in the thickness direction of the module substrate.

A portion of the ground layer may overlap an entirety of the filter module in the thickness direction of the module substrate.

The first region may correspond to a space defined by an area in which the filter module and the ground layer overlap each other in the thickness direction of the module substrate, and a space between the filter module and the ground layer.

A portion of at least one of the wiring layers and at least one of the wiring vias disposed in the first region may form at least one of an inductor and a capacitor connected to the filter module.

The communications module may include an electronic component electrically separated from the filter module, and at least one of the wiring layers and at least one of the wiring vias connected to the electronic component may be disposed in a second region of the module substrate different from the first region.

The communications module may include a front-end module mounted on the module substrate, and electrically connected to the filter module. The filter module and the front-end module may be electrically connected to each other through at least one of the wiring vias.

A portion of the at least one wiring via electrically connecting the filter module to the front-end module may penetrate through the ground layer.

The filter module may include a plurality of volume acoustic resonators.

In another general aspect, a communications module includes a module substrate composed of a plurality of insulating layers, a plurality of wiring layers, and a plurality of wiring vias; a filter module disposed on the module substrate; and an electronic component electrically separated from the filter module. At least one of the wiring layers overlaps the filter module and is connected to a ground potential to function as a ground layer, and at least one of the wiring layers and at least one of the wiring vias are connected to the electronic component and disposed in a second region of the module substrate different from a first region between the filter module and the ground layer in a thickness direction of the module substrate.

The filter module and the electronic component may be disposed on different surfaces of the module substrate.

The filter module and the electronic component may be disposed on a same surface of the module substrate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
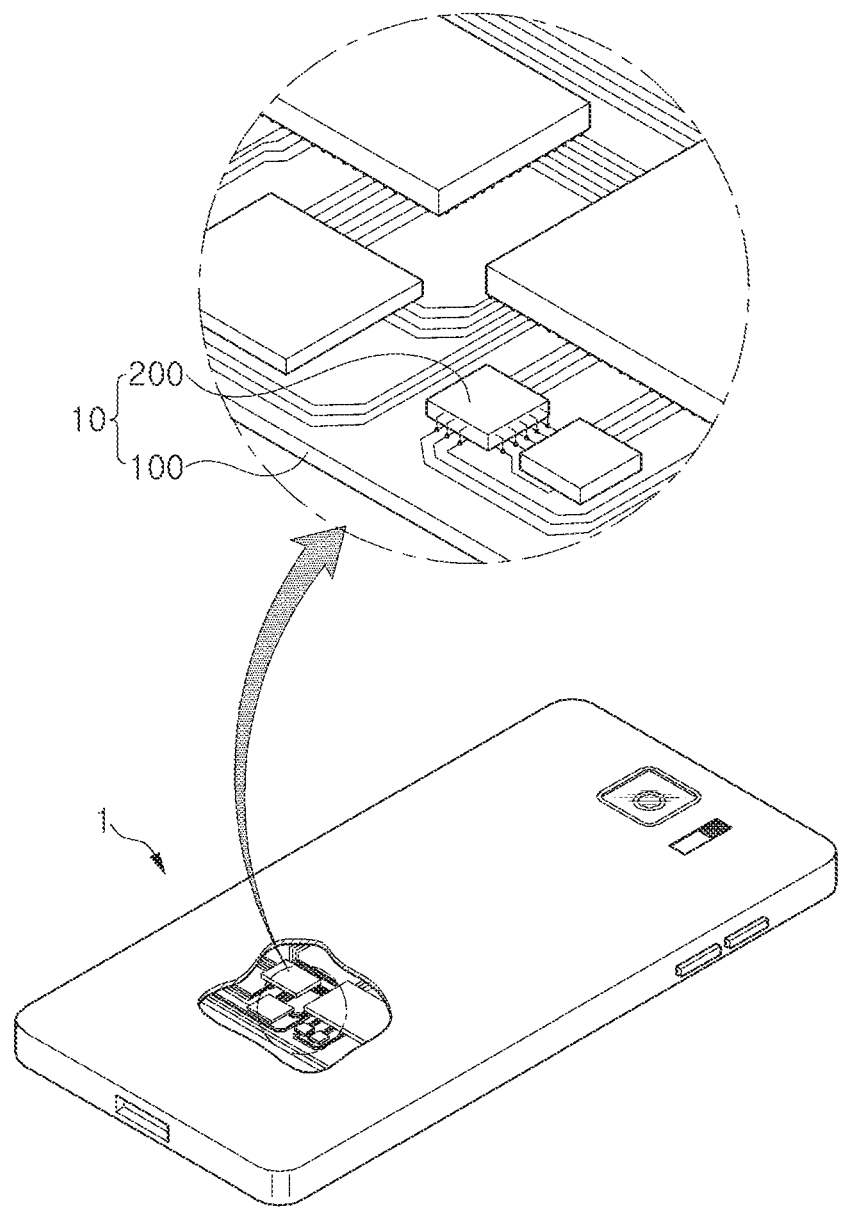
FIG. 1 is a schematic perspective view illustrating a communications module employed in an electronic device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic perspective view illustrating a communications module employed in an electronic device according to an example.

An electronic device 1 may perform a wireless communication using various communication networks such as Code Division Multiple Access (CDMA), Global System for Mobile (GSM), General Packet Radio Service (GPRS), Enhanced Data Gsm Environment (EDGE), Universal Mobile Telecommunications System (UMTS), Code Division Multiple Access (CDMA), Wideband Code Division Multiple Access (WCDMA), Long Term Evolution (LTE), Wireless Broadband Internet (Wibro), and the like, and using a network having an extended and modified form of the networks described above. The electronic device 1 may perform a wireless communication in a multi-band method using various frequency bands.

Referring to FIG. 1, a communications module 10 may include a module substrate 100 and a plurality of electronic components 200, and may transmit and receive radio frequency (RF) signals with an external communication device and a communication base station.

A plurality of electronic components 200 may be provided on the module substrate 100. For example, the module substrate 100 may be a printed circuit board (PCB). The module substrate 100 may be implemented as a flexible substrate, a dielectric substrate, a glass substrate, and the like. The module substrate 100 may be a multilayer substrate formed by alternately stacking a plurality of insulating layers and a plurality of wiring layers.

An electronic component 200 may be provided in a plurality of numbers. The plurality of electronic components 200 may be disposed on at least one surface of the module substrate 100, or may be disposed inside the module substrate 100. The plurality of electronic components 200 may be electrically connected through a wiring layer and a wiring via of the module substrate 100. For example, the plurality of electronic components 200 may include a filter module, a front-end module, a chipset, and an application processor.

Figure 2:
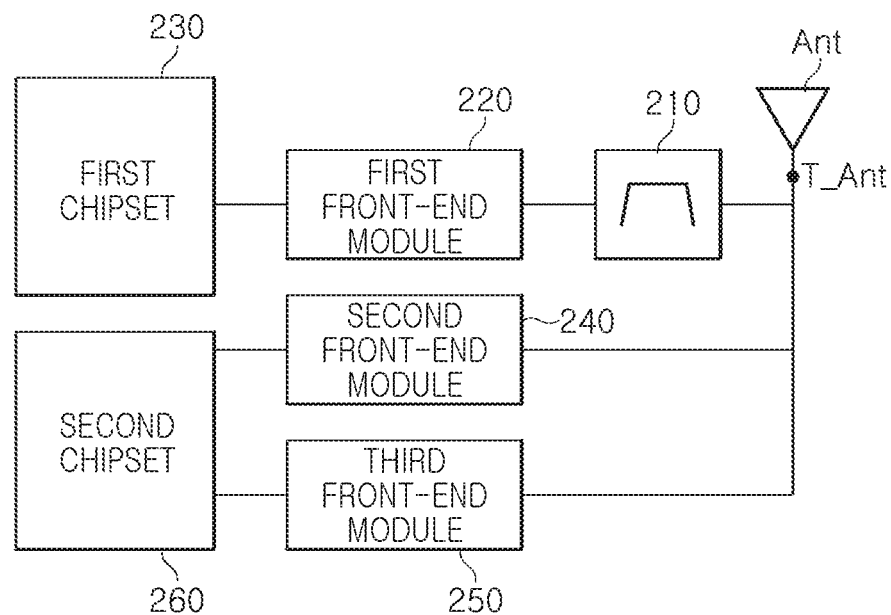
FIG. 2 is a block diagram of a communications module according to an example.
Figure 3:
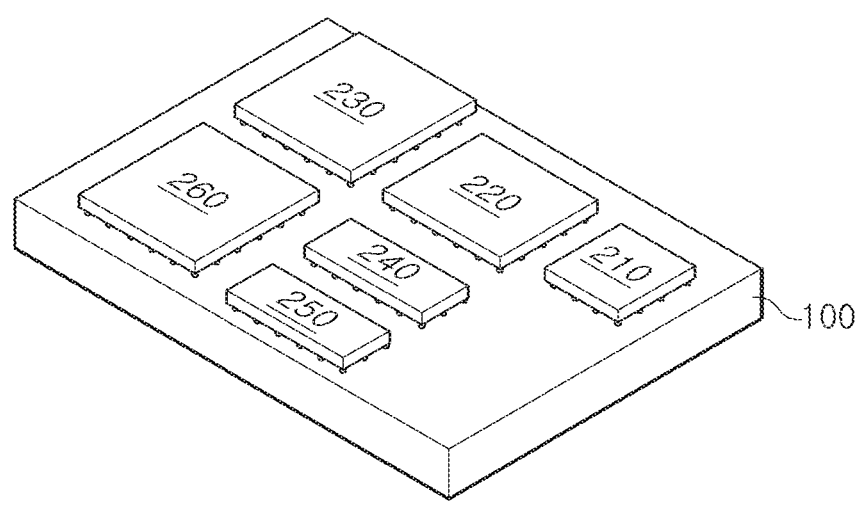
FIG. 3 is a perspective view of a communications module according to an example.

FIG. 2 is a block diagram of a communications module according to an example, and FIG. 3 is a perspective view of a communications module according to an example.

Referring to FIGS. 2 and 3, a communications module 10 may include a filter module 210, a first front-end module 220, a first chipset 230, a second front-end module 240, a third front-end module 250, and a second chipset 260.

The filter module 210, the first front-end module 220, and the first chipset 230 may be sequentially connected, and the filter module 210 may be connected to an antenna Ant, through an antenna terminal T_Ant.

The first front-end module 220 may receive an RF signal provided from an outside through the filter module 210 and the antenna Ant and transmit the received RF signal to the first chipset 230, or may transmit an RF signal transmitted from the first chipset 230 through the filter module 210 and the antenna Ant.

The first front-end module 220 may transmit and receive an RF signal of a first frequency band. For example, the first front-end module 220 may transmit and receive an RF signal in a 2.4025 GHz to 2.4815 GHz band corresponding to the first frequency band.

The filter module 210 may be disposed between the first front-end module 220 and the antenna terminal T_Ant, to filter a predetermined frequency band. For example, the filter module 210 may have a pass band of the 2.4025 GHz to 2.4815 GHz band corresponding to the first frequency band. The filter module 210 may include a plurality of volume acoustic resonators.

The first chipset 230 may receive an RF signal of the first frequency band provided from the first front-end module 220, and may provide the RF signal of the first frequency band to the first front-end module 220, to control a first communication. For example, the first chipset 230 may control a Wi-Fi communication corresponding to the first communication. The first chipset 230 for transmitting and receiving RF signals of the 2.4025 GHz to 2.4815 GHz band corresponding to the first frequency band may be responsible for a Wi-Fi communication of the 2.4025 GHz to 2.4815 GHz band.

Each of the second front-end module 240 and the third front-end module 250 may be connected to the antenna Ant through the antenna terminal T_Ant. Each of the second front-end module 240 and the third front-end module 250 may be connected to the second chipset 260. The second chipset 260 may be connected to the antenna terminal T_Ant through each of the second front-end module 240 and the third front-end module 250.

The second front-end module 240 may transmit and receive an RF signal of a second frequency band. For example, the second front-end module 240 may transmit and receive an RF signal of a 2.496 GHz to 2.69 GHz band corresponding to the second frequency band. Specifically, the second front-end module 240 may transmit and receive RF signals in a 2.5 GHz to 2.57 GHz band, a 2.57 GHz to 2.62 GHz band, or a 2.496 GHz to 2.69 GHz band.

The third front-end module 250 may transmit and receive an RF signal of a third frequency band. For example, the third front-end module 250 may transmit and receive an RF signal in a 3.3 GHz to 5.0 GHz band corresponding to the third frequency band. Specifically, the third front-end module 250 may transmit and receive RF signals in a 3.3 GHz to 4.2 GHz band, or a 4.4 GHz to 5.0 GHz band.

The second chipset 260 may receive an RF signal of the second frequency band provided from the second front-end module 240, and may provide the received RF signal of the second frequency band to the second front-end module 240, to control a second communication.

The second chipset 260 may receive an RF signal of the third frequency band provided from the third front-end module 250, and may provide the received RF signal of the third frequency band to the third front-end module 250, to control a second communication.

For example, the second chipset 260 may control a cellular communication corresponding to the second communication. The second chipset 260 for transmitting and receiving RF signals of the 2.496 GHz to 2.69 GHz band corresponding to the second frequency band and the 3.3 GHz to 5.0 GHz band corresponding to the third frequency band may be responsible for cellular communications in the 3.3 GHz to 5.0 GHz band.

The first front-end module 220, the second front-end module 240, and the third front-end module 250 may transmit and receive an RF signal, through one antenna Ant.

According to a trend of slimming and miniaturizing electronic devices, since there is a physical limitation in implementing a plurality of antennas in an electronic device, it is necessary to transmit and receive RF signals of different frequency bands through one antenna.

When transmitting and receiving RF signals of different frequency bands, through one antenna, a wideband attenuation characteristic of the filter module 210 may be sufficiently secured.

The filter module 210 may be configured with a plurality of acoustic resonators having excellent attenuation characteristics, thereby minimizing signal interference of the first frequency band, with respect to the second frequency band. However, there may be a problem that it is realistically difficult for the filter module 210 requiring miniaturization to have a sufficient attenuation characteristic for the third frequency band in addition to the second frequency band adjacent to the pass band.

Therefore, a frequency response characteristic of the filter module 210 may need to be improved according to a pattern design of the module substrate 100 on which the filter module 210 is mounted.

It is illustrated that the filter module 210 is provided in a front-end of the first front-end module 220 in FIG. 2, but according to various examples, in order for the first frequency band, the second frequency band, and the third frequency band to have sufficient attenuation characteristics with respect to each other, the filter module 210 may be provided at a front-end of the second front-end module 240 and the third front-end module 250, in addition to the first front-end module 220, and may be provided at a front-end of any one of the first front-end module 220, the second front-end module 240, and the third front-end module 250.

Figure 4:
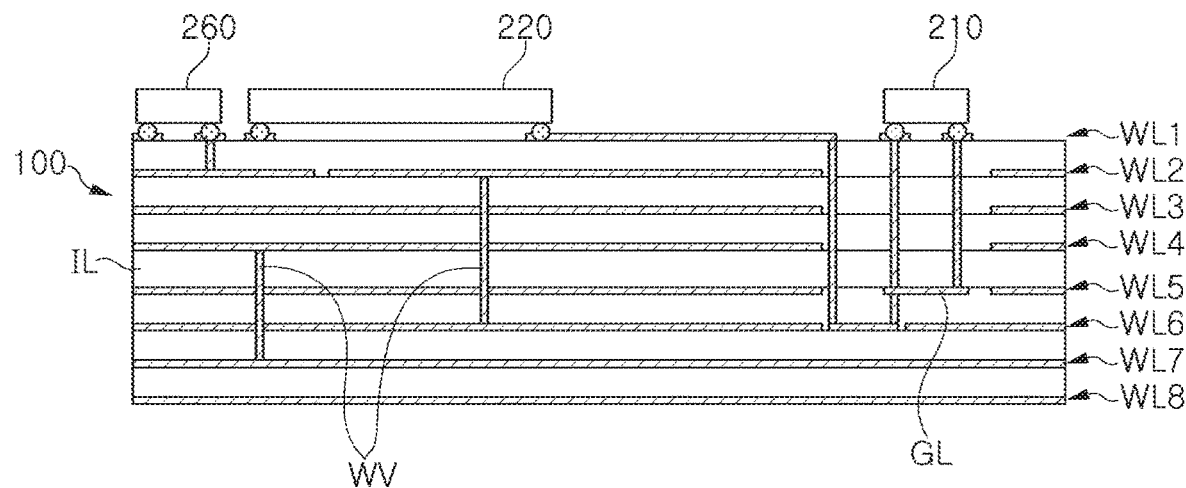
FIG. 4 is a partial cross-sectional view of a communications module according to an example.

FIG. 4 is a partial cross-sectional view of a communications module according to an example.

Referring to FIG. 4, the filter module 210 and the first front-end module 220 may be mounted on one surface of the module substrate 100, specifically, an upper surface of the module substrate 100.

For example, the module substrate 100 may be a printed circuit board (PCB). The module substrate 100 may be implemented as a flexible substrate, a dielectric substrate, a glass substrate, and the like. The module substrate 100 may be composed of a plurality of layers. The module substrate 100 may be formed of a multilayer substrate in which a plurality of insulating layers IL and a plurality of wiring layers WL1 to WL8 are alternately stacked. At least one of the plurality of wiring layers WL1 to WL8 may include two outer layers provided on one surface and the other surface of the module substrate 100 and at least one inner layer provided between the two outer layers. For example, the insulating layer IL may be formed of an insulating material such as prepreg, Ajinomoto build-up film (ABF), FR-4, and bismaleimide triazine (BT). The insulating material may be a thermosetting resin such as an epoxy resin, a thermoplastic resin such as polyimide, or a material in which these resins are impregnated with a core such as glass fiber, glass cloth, and glass fabric, together with an inorganic filler. In some examples, the insulating layer IL may be formed of a photosensitive insulating resin.

The plurality of wiring layers WL1 to WL8 may be formed of a conductive material such as copper (Cu), aluminum (Al), silver (Ag), tin (Sn), gold (Au), nickel (Ni), lead (Pb), titanium (Ti), or alloys thereof. Each of the first to eighth wiring layers WL1 to WL8 of the plurality of wiring layers WL1 to WL8 may be provided on each of the first to eighth layers of the module substrate 100.

A plurality of wiring vias WV for interconnecting a portion of the wiring layers WL1 to WL8 are disposed in the insulating layer IL. The wiring via WV may be formed of a conductive material such as copper (Cu), aluminum (Al), silver (Ag), tin (Sn), gold (Au), nickel (Ni), lead (Pb), titanium (Ti), or alloys thereof.

The filter module 210 and the first front-end module 220 mounted on one surface of the module substrate 100 may be electrically connected to each other. For example, the filter module 210 and the first front-end module 220 may be electrically connected to each other through the first wiring layer WL1—the wiring via WV—the sixth wiring layer WL6—the wiring via WV. Referring to FIG. 4, a wiring via WV electrically connecting the sixth wiring layer WL6 and the filter module 210 may penetrate through a ground layer GL.

Based on a mounting surface of the filter module 210 of the plurality of wiring layers WL1 to WL8 of the module substrate 100, a portion of wiring layers provided below the filter module 210 may be connected to a ground potential, and may function as the ground layer GL.

The ground layer GL may improve a frequency response characteristic of the filter module 210. According to a distance between the filter module 210 and the ground layer GL, the frequency response characteristic of the filter module 210 may be determined. Therefore, the distance between the filter module 210 and the ground layer GL may be determined according to the frequency response characteristic of the designed filter module 210. The filter module 210 and the ground layer GL may be connected to each other through the wiring via WV.

For example, as shown in FIG. 4, the ground layer GL may be implemented by the fifth wiring layer WL5 provided in the fifth layer of the module substrate 100, and may be implemented by at least one wiring layer of the second to eighth wiring layers WL2-WL8. Hereinafter, for convenience of explanation, it is described that the ground layer GL is implemented by the fifth wiring layer WL5. However, the following description may be applied to the ground layer provided on another of the other wiring layers.

The ground layer GL is formed in a shape corresponding to the filter module 210. For example, when the filter module 210 is formed in a quadrangular shape, the ground layer GL may be formed in a quadrangular shape corresponding to the filter module 210.

The ground layer GL may be formed to have the same or larger area as that of the filter module 210, and the area of the ground layer GL may overlap area of the filter module 210 in a vertical direction (a thickness direction of the module substrate 100). A portion of areas of the ground layer GL may overlap an entire area of the filter module 210. A portion of areas of the ground layer GL may overlap the entire area of the filter module 210, such that the frequency response characteristic of the filter module 210 may be more easily improved.

At least one wiring layer and at least one wiring via of the plurality of wiring layers WL1 to WL8 and the plurality of wiring vias WV are provided in a first region in a thickness direction of the module substrate 100 between the filter module 210 and the ground layer GL. Here, the first region in the thickness direction of the module substrate 100 between the filter module 210 and the ground layer GL may be understood as a space defined by an area in which the filter module 210 and the ground layer GL overlap with each other, when viewed from the thickness direction of the module substrate 100 and a distance between the filter module 210 and the ground layer GL.

An entirety of at least one wiring layer and at least one wiring via provided in the first region may be electrically connected to the filter module 210. A portion of at least one wiring layer and at least one wiring via provided in the first region may form at least one of an inductor and a capacitor connected to the filter module 210. The inductor and the capacitor formed by the pattern design of a portion of at least one wiring layer and at least one wiring via may adjust an impedance characteristic of the filter module 210.

At least one wiring layer and at least one wiring via connected to an electronic component (e.g., the second chipset 260 of FIG. 2) electrically separated from the filter module 210 may be provided in a second region of the module substrate 100. Here, the second region of the module substrate 100 is a region different from the first region of the module substrate 100, and a remaining region except for the first region of the module substrate 100 may be understood as the second region of the module substrate 100.

According to an example, by providing only a wiring layer and a wiring via electrically connected to the filter module 210 and an inductor and a capacitor implemented by the wiring layer and the wiring via in a first region in the thickness direction of the module substrate 100 between the filter module 210 and the ground layer GL, the first region of the module substrate 100 may be used as a space for the filter module 210. Therefore, a filtering characteristic may be improved while the filter module 210 is miniaturized.

Figure 5:
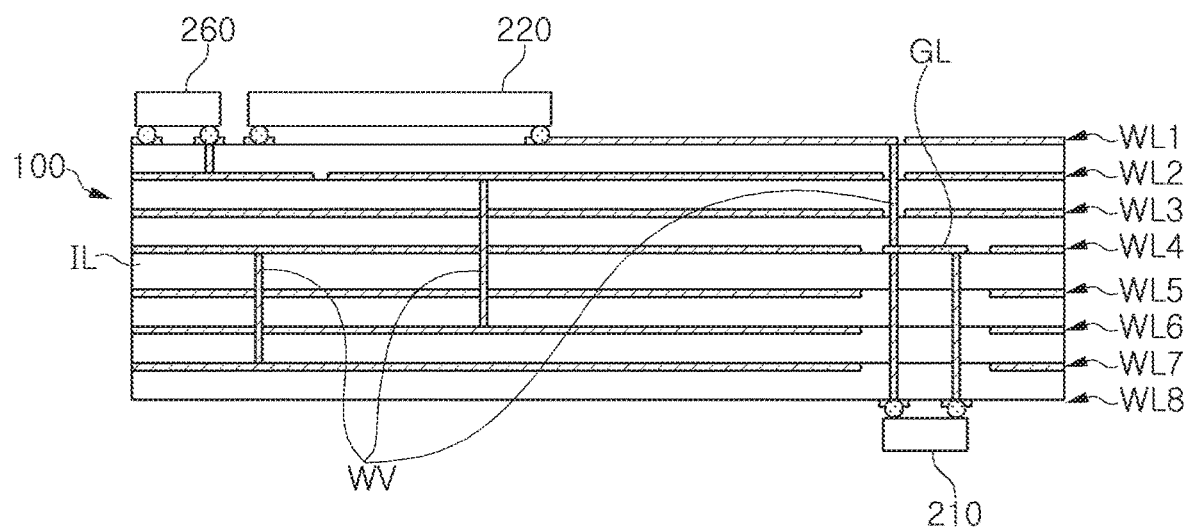
FIG. 5 is a partial cross-sectional view of a communications module according to an example.

FIG. 5 is a partial cross-sectional view of a communications module according to an example.

Since the communications module according to an example of FIG. 5 has some similarity to the communications module according to the example of FIG. 4, redundant descriptions thereof will be omitted, and descriptions will be made based on differences.

Referring to FIG. 5, a first front-end module 220 may be mounted on one surface, specifically, on an upper surface of the module substrate 100, and a filter module 210 may be mounted on the other surface, specifically, on a lower surface of the module substrate 100.

The first front-end module 220 mounted on a first layer of the module substrate 100 and the filter module 210 mounted on an eighth layer thereof may be electrically connected by the first wiring layer WL1—the wiring via WV.

Based on a mounting surface of the filter module 210 of the plurality of wiring layers WL1 to WL8 of the module substrate 100, a portion of wiring layers provided above the filter module 210 may be connected to a ground potential, and function as a ground layer GL.

The ground layer GL may improve a frequency response characteristic of the filter module 210. According to a distance between the filter module 210 and the ground layer GL, the frequency response characteristic of the filter module 210 may be determined. Therefore, the distance between the filter module 210 and the ground layer GL may be determined according to the frequency response characteristic of the designed filter module 210. The filter module 210 and the ground layer GL may be connected to each other through the wiring via WV.

For example, as shown in FIG. 5, the ground layer GL may be implemented by the fourth wiring layer WL4 provided in the fourth layer of the module substrate 100, and may be implemented by at least one wiring layer of the first to seventh wiring layers WL1-WL7. Hereinafter, for convenience of explanation, it is described that the ground layer GL is implemented by the fourth wiring layer WL4. However, the following description may be applied to the ground layer provided on one of the other wiring layers.

The ground layer GL may be formed in a shape corresponding to the filter module 210. When the filter module 210 is formed in a quadrangular shape, the ground layer GL may be formed in a quadrangular shape corresponding to the filter module 210.

The ground layer GL may be formed to have the same or similar area as that of the filter module 210, and an area of the ground layer GL may overlap an area of the filter module 210 in a vertical direction (a thickness direction of the module substrate 100). A portion of areas of the ground layer GL may overlap an entire area of the filter module 210. A portion of areas of the ground layer GL may overlap the entire area of the filter module 210, such that the frequency response characteristic of the filter module 210 may be more easily improved.

At least one wiring layer and at least one wiring via of the plurality of wiring layers WL1 to WL8 and the plurality of wiring vias WV may be provided in the first region in the thickness direction of the module substrate 100 between the filter module 210 and the ground layer GL. Here, the first region in the thickness direction of the module substrate 100 between the filter module 210 and the ground layer GL may be understood as a space defined by an area in which the filter module 210 and the ground layer GL are overlapped with each other and a distance between the filter module 210 and the ground layer GL, when viewed from the thickness direction of the module substrate 100.

An entirety of at least one wiring layer and at least one wiring via provided in the first region may be electrically connected to the filter module 210. A portion of at least one wiring layer and at least one wiring via provided in the first region may form at least one of an inductor and a capacitor connected to the filter module 210. The inductor and the capacitor formed by the pattern design of a portion of at least one wiring layer and at least one wiring via may adjust an impedance characteristic of the filter module 210.

At least one wiring layer and at least one wiring via connected to an electronic component (e.g., the second chipset 260 of FIG. 2) electrically separated from the filter module 210 may be provided in a second region of the module substrate 100, different from the first region. Here, the second region of the module substrate 100 is a region different from the first region of the module substrate 100, and a remaining region except for the first region of the module substrate 100 may be understood as the second region of the module substrate 100.

According to an example, by providing only a wiring layer and a wiring via electrically connected to the filter module 210 and an inductor and a capacitor implemented by the wiring layer and the wiring via in a first region in the thickness direction of the module substrate 100 between the filter module 210 and the ground layer GL, the first region of the module substrate 100 may be used as a space for the filter module 210. Therefore, a filtering characteristic may be improved while the filter module 210 is miniaturized.

As set forth above, according to the various examples, a frequency response characteristic of a filter module may be improved according to a design of a module substrate, thereby supporting multiple frequency bands of a communications module.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A communications module, comprising:
   a module substrate comprising a plurality of insulating layers, a plurality of wiring layers, and a plurality of wiring vias;
   a filter module disposed on the module substrate; and
   a front-end module disposed on the module substrate and electrically connected to the filter module,
   wherein at least one of the plurality of wiring layers overlaps the filter module in a thickness direction of the module substrate and is connected to a ground potential to function as a ground layer,
   wherein an entirety of at least one of the plurality of wiring layers and at least one of the plurality of wiring vias disposed in a first region in the thickness direction of the module substrate between the filter module and the ground layer are electrically connected to the filter module, and
   wherein at least one of the plurality of wiring vias penetrates through the ground layer, is electrically connected to at least one of the plurality of wiring vias disposed in a second region of the module substrate different from the first region, and is electrically connected to the front-end module.

2. The communications module of claim 1, wherein the ground layer comprises a shape corresponding to a shape of the filter module.

3. The communications module of claim 1, wherein the ground layer overlaps at least a portion of the filter module in the thickness direction of the module substrate.

4. The communications module of claim 1, wherein a portion of the ground layer overlaps an entirety of the filter module in the thickness direction of the module substrate.

5. The communications module of claim 1, wherein the first region corresponds to a space defined by an area in which the filter module and the ground layer overlap each other in the thickness direction of the module substrate, and a space between the filter module and the ground layer.

6. The communications module of claim 1, wherein a portion of at least one of the plurality of wiring layers and at least one of the plurality of wiring vias disposed in the first region form at least one of an inductor and a capacitor connected to the filter module.

7. The communications module of claim 1, further comprising an electronic component electrically separated from the filter module,
wherein at least one of the plurality of wiring layers and at least one of the plurality of wiring vias connected to the electronic component are disposed in the second region of the module substrate.

8. The communications module of claim 1, wherein the filter module comprises a plurality of volume acoustic resonators.

9. A communications module, comprising:
a module substrate comprising a plurality insulating layers, a plurality of wiring layers, and a plurality of wiring vias;
a filter module disposed on the module substrate;
an electronic component electrically separated from the filter module; and
a front-end module disposed on the module substrate and electrically connected to the filter module,
wherein at least one of the plurality of wiring layers overlaps the filter module and is connected to a ground potential to function as a ground layer,
wherein at least one of the plurality of wiring layers and at least one of the plurality of wiring vias disposed in a first region in the thickness direction of the module substrate between the filter module and the ground layer are electrically connected to the filter module,
wherein at least one of the plurality of wiring vias penetrates through the ground layer, is electrically connected to at least one of the plurality of wiring vias disposed in a second region of the module substrate different from the first region, and is electrically connected to the front-end module, and
wherein at least one of the plurality of wiring layers and at least one of the plurality of wiring vias are connected to the electronic component and disposed in the second region.

10. The communications module of claim 9, wherein the ground layer comprises a shape corresponding to a shape the filter module.

11. The communications module of claim 9, wherein the ground layer overlaps at least a portion of the filter module in the thickness direction of the module substrate.

12. The communications module of claim 9, wherein a portion of the ground layer overlaps an entirety of the filter module in the thickness direction of the module substrate.

13. The communications module of claim 9, wherein a portion of at least one of the plurality of wiring layers and at least one of the plurality of wiring vias disposed in the first region form at least one of an inductor and a capacitor connected to the filter module.

14. The communications module of claim 9, wherein the filter module and the electronic component are disposed on different surfaces of the module substrate.

15. The communications module of claim 9, wherein the filter module and the electronic component are disposed on a same surface of the module substrate.

* * * * *